United States Patent [19]
Fukazawa et al.

[11] Patent Number: 5,371,683
[45] Date of Patent: Dec. 6, 1994

[54] LSI DESIGN SUPPORT SYSTEM

[75] Inventors: Takayuki Fukazawa; Kunihiko Yamagishi; Eiichi Yano; Masatoshi Sekine, all of Yokohama, Japan

[73] Assignee: Kabushiki Kaisha Toshiba, Kawasaki, Japan

[21] Appl. No.: 769,592

[22] Filed: Oct. 3, 1991

Related U.S. Application Data

[63] Continuation-in-part of Ser. No. 497,021, Mar. 21, 1990, abandoned.

[30] Foreign Application Priority Data

Mar. 22, 1989 [JP] Japan .................................. 1-67681
Aug. 2, 1989 [JP] Japan .................................. 1-199465

[51] Int. Cl.$^5$ .............................................. G06F 15/60
[52] U.S. Cl. .................................... 364/489; 364/488
[58] Field of Search ................. 364/488, 489, 490, 491

[56] References Cited

U.S. PATENT DOCUMENTS

| | | | |
|---|---|---|---|
| 4,635,208 | 1/1987 | Coleby et al. | 364/491 |
| 4,656,603 | 4/1987 | Dunn | 364/488 |
| 4,813,013 | 3/1989 | Dunn | 364/488 |
| 4,833,619 | 5/1989 | Shimizu et al. | 364/489 |
| 4,922,432 | 5/1990 | Kobayashi et al. | 364/490 |

OTHER PUBLICATIONS

"Sylam: An Adaptative Symbolic Layout System" by Landrault et al., European Conf. on Electronic Design Automation (EDA84), 1984, pp. 97–101.
"A Front End Graphic Interface to the First Silicon Compiler" by Nash et al., European Conference on EDA, 1984, pp. 120–124.
"On the Integration of A CAD System for IC Design" by da Costa, European Conference on EDA, 1984, pp. 40–45.

Primary Examiner—Vincent N. Trans
Attorney, Agent, or Firm—Foley & Lardner

[57] ABSTRACT

Disclosed is an LSI design support system for making a functional design of LSI using a graphic input method. This system comprises a state transition diagram preparation portion for preparing a state transition diagram, state transition table preparation portion for preparing a state transition table, and a state-operation circuit diagram preparation portion for preparing a state-operation circuit diagram. Data from these preparation portions are examined therebetween and the results are displayed at the same time on a picture plane so that a designer can efficiently make a design on circuit operation including its state transition. Also disclosed is another LSI design support system. As well as the preparation portions in the above system, this system comprises a transitional-condition analysis portion for analyzing transitional conditions of a state transition diagram obtained by the state transition diagram preparation portion or a state transition table obtained by the state transition table, an automatic-layout-wiring program execution portion for preparing a state transition diagram by data from the state transition table, and an automatic-table-preparation program execution portion for preparing a state transition table by data from the state transition diagram.

19 Claims, 13 Drawing Sheets

| INPUT VALUE | TRANSITIONAL TARGET STATE/OUTPUT VALUE | |
|---|---|---|
| | 0 | 1 |
| $q_0$ | $q_0/0$ | $q_1/1$ |
| $q_1$ | $q_0/0$ | $q_1/1$ |

FIG.9
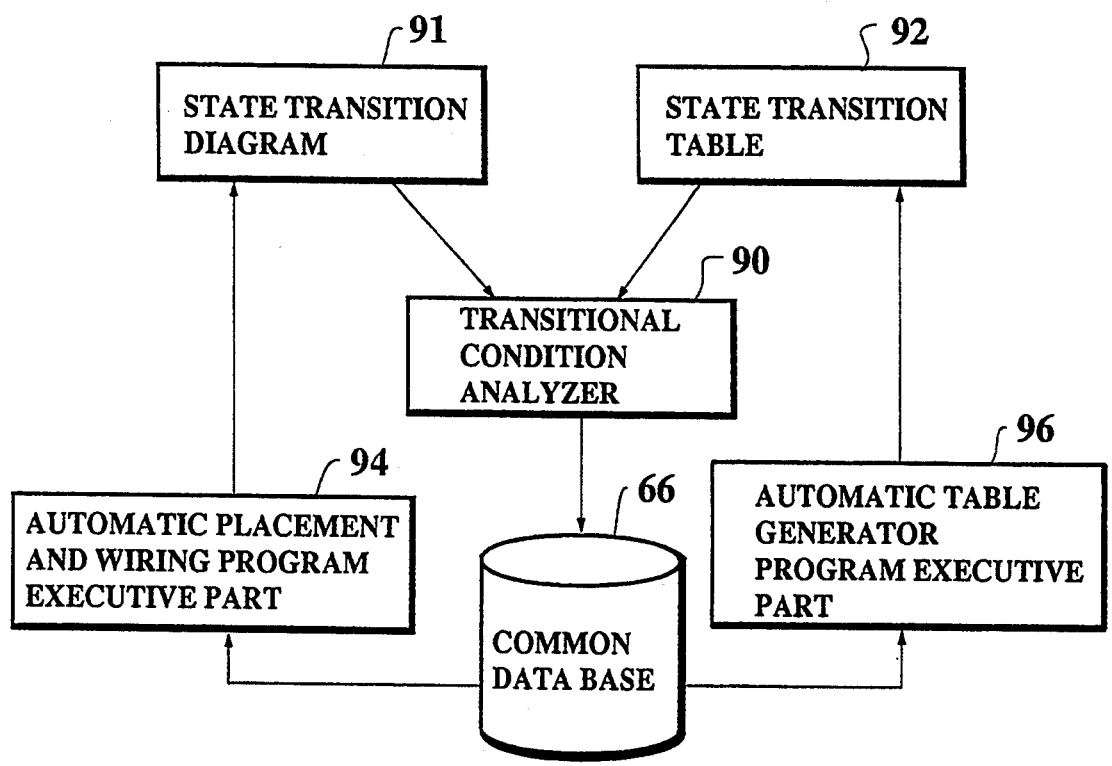
FIG.10A
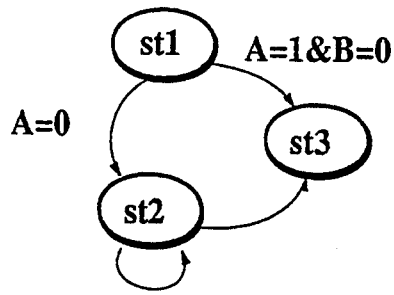
FIG.10B
| st1 | |
|---|---|
| A!! | B |
| 0? | st2 |
| 10 | st3 |

LSI DESIGN SUPPORT SYSTEM

This application is a continuation-in-part of application Ser. No. 07/497,021, filed Mar. 21, 1990, by Takayuki Fukazawa et al.

BACKGROUND OF THE INVENTION

1. Field of the Invention

The present invention relates to an LSI (large scale integrated circuit) design support system for a function design of LSI based on a graphic input method, and particularly to an LSI design support system which can realize rationalization of the design work.

2. Description of the Prior Art

Generally, as conventional function designs of LSI, there are a design of static circuit operation and another of a state transition system for determining the order of the circuit operation and controlling the operational states.

In such types of designs, designers described directly with a special language. Therefore, the designers must be limited to those who are well versed in the special language.

To solve the problem, there is a design support system of LSI based on a graphic input system, which can perform the function design of LSI without any special language for description even when the designer does not have special knowledge of the language. When the graphic input system is used for designing all the circuit operation, each circuit for expressing a predetermined function thereof can be graphically shown to complete the function design. However, the conventional graphic input system is always employed for the design of a circuit in an operational state. In such a design input system, circuit operation states always input the operational states. Therefore, the states of circuit operation are expressed by providing flip-flops for respectively assigning the operational expressions in the circuit. Each flip-flop is given a state signal which serves as a control signal for expressing the corresponding circuit operation. Accordingly, in this case, a great many of flip-flops must be required, and a circuit diagram to be obtained must be in a large scale and complicated.

While, in the design of a state transition system, there is a method of expressing order of a state translation by assignment of transitional conditions C1 to C6 between respective states st0 to st4 as shown in FIG. 1A. In a transition system shown in FIG. 1B, when 1 is inputted to a state q0, the state q0 changes into a state q1 and 1 is outputted therefrom. The fact is also expressed by a state transition table as shown in FIG. 1C. Conventionally, there is also a known design support system based on a graphic input method by using a table for expressing a transition system as stated above.

However, when the number of the transition states is large, the transitional conditions to be nested in the state transition table are increased so that a state transition diagram to be obtained becomes extremely complicated and difficult to understand. Moreover, when the transition conditions are complicatedly nested in the table, it becomes difficult for the designer to guess the relationship between the transition states so that a lot of time must be required for the design work. Thus, it is difficult to smoothly carry out the design work by such conventional methods.

Moreover, in a conventional design of circuit operation and a transition state system, a state transition diagram or a state transition table is designed separately from the circuit operational portion. Thus, there is not a known method of designing circuit operation and a state transition system at the same time using a circuit diagram, a state transition diagram and a state transition table together. Therefore, it is difficult to efficiently carry out a design with grasping both the circuit conditions and the circuit operation. Namely, in the conventional LSI design support systems, the circuit operation and the state transition system are designed separately by the graphic (circuit diagram) input, thus it takes much time to carry out designs based on such systems.

Furthermore, when the conditions of the state transition are not decided, the design must be stopped at the stage. Therefore, to carry out the design efficiently, the transition conditions should be completely defined in advance, however, once defined, the conditions cannot be added or changed on the way of the circuit design. Accordingly, it is difficult to carry out a flexible design therefor.

SUMMARY OF THE INVENTION

The present invention is invented in the light of the above problems, therefore it is an object thereof to provide a design support system of LSI which can realize a facile function design of LSI and reduce the design term.

To achieve the object, a preferred embodiment of the present invention comprises state transition diagram preparation means for preparing a state transition diagram to show transition relationships between states of a circuit by graphic input, state transition table preparation means for preparing a table to show transition conditions between transitable states in the state transition diagram prepared by the state transition diagram preparation means, and state-operation circuit preparation means for preparing a state-operation circuit diagram, i.e., a circuit diagram (or description including characters and symbols) corresponding to operation in each state shown in the state transition diagram prepared by the state transition diagram preparation means by graphic input or description input.

The LSI design support system having the above-mentioned construction, displays the state transition diagram prepared by the state transition diagram preparation means, a state transition table prepared by the state transition table preparation means, and the circuit diagram prepared by the state-operation circuit preparation means at the same time on its picture plane to realize a design work by which the relationships of these can be grasped at the same time. Accordingly, since the system can provide conditions required for a design method in which operational states of a circuit to be designed can be simultaneously grasped, it becomes possible to carry out a design which is functionally near to a thought pattern of the designer. Namely, according to the system, the design work can be efficiently and easily carried out, and the design term can be reduced.

Another preferred embodiment of the LSI design system of the present invention comprises state transition diagram preparation means for preparing a state transition diagram to show transition relationships between states of a circuit by graphic input, state transition table preparation means for preparing a state transition table to show transition conditions between transitable states in the circuit by state transition data input, state-operation circuit preparation means for preparing a circuit diagram or description including descriptive characters and descriptive symbols to show operation in the states shown in the state transition diagram prepared by the state transition diagram preparation means and the state transition table prepared by the state transition table preparation means by graphic input or description input, and graphic conversion means for converting a state transition diagram by the state transition diagram preparation means into a corresponding state transition table or converting a state transition table by the state transition table preparation means into a corresponding state transition diagram, and display means for displaying a state transition diagram by the state transition diagram preparation means, a state transition table by the state transition table preparation means, a graphic obtained by conversion from a state transition diagram into a corresponding state transition table or a graphic obtained by conversion from a state transition table into a corresponding state transition diagram by the conversion means, and at least one of a state-operation circuit diagram and description including characters and symbols prepared by the state-operation circuit preparation means.

According to the LSI design support system of the embodiment, the state transition diagram to show the transition relationships between states of a circuit is prepared by the state transition diagram preparation means, or the state transition table is prepared by inputting state transition data to show transitional conditions of the circuit by the state transition table preparation means. Then, the state transition table is prepared by the automatic conversion from the state transition diagram by the state transition diagram preparation means, or the state transition diagram is prepared by the automatic conversion from the state transition table prepared by the state transition table preparation means by the graphic conversion means. Moreover, the state-operation circuit diagram or the description to show operation in each state in the state transition diagram or the state transition table is prepared by the state-operation circuit preparation means. The state transition diagram, the state transition table and the state-operation circuit diagram or the description are displayed by the display means for a designer related to the circuit design work. Accordingly, since the graphic conversion means for automatically preparing the state transition table from the state transition diagram by the state transition diagram preparation means or automatically preparing the state transition diagram from the state transition table by the state transition table preparation means is provided in the system, the designer can automatically prepare the state transition diagram or the state transition table only by inputting either of state transition diagram data or state transition table data in which the state transition conditions are inputted.

Moreover, still another preferred embodiment of the LSI design support system of the present invention comprises state transition diagram preparation means for preparing a state transition diagram to show transitional relationships between states of a circuit by graphic input, state transition table preparation means for preparing a state transition table to show transitional conditions between transitable states in the state transition diagram by the state transition diagram preparation means, state-operation circuit preparation means for preparing a circuit diagram or description including characters or symbols to show operation in each state in the state transition diagram by the state transition diagram preparation means by graphic input or description input so that the circuit diagram or the description can be separately expressed into a portion which is operative in a state, another portion which is operative in another state to be compared to the state and the other portions, and display means for displaying the state transition diagram by the state transition diagram preparation means, the state transition table by the state transition table preparation means, and the state-operation circuit diagram or the description prepared by the state-operation circuit preparation means.

According to the LSI design support system of the embodiment, the state transition diagram to show the transitional relationships between states of a circuit is prepared by the state transition diagram preparation means, and the state transition table to show the transitional conditions between the transitable states in the state transition diagram is prepared by the state transition table preparation means. The state-operation circuit diagram or the description to show operation in each state shown in the state transition diagram by the state transition diagram preparation means is prepared by the graphic input or the description input by the state-operation circuit preparation means. Further, in the state-operation circuit diagram or the description, the portion which is operative in a state to be noted, another portion operative in another state to be compared to the state to be noted and the other portions are separately expressed. Accordingly, since the operative portion in a circuit in the state to be noted, another operative portion of the circuit in another state to be compared to the operative portion in the state to be noted and the other portions of the circuit are separately displayed by the state-operation circuit preparation means, it is possible to design a circuit comparing these separately operative portions at the same time so that the design work can be carried out efficiently. Moreover, since the state transition diagram by the state transition diagram preparation means, the state transition table by the state transition table preparation means and the state-operation circuit diagram or the description by the state-operation circuit preparation means are displayed by the display means at the same time, the design work of the LSI circuit can be carried out still efficiently.

These and other objects, features and advantages of the present invention will be more apparent from the following description of a preferred embodiment, taken in conjunction with the accompanying drawings.

BRIEF DESCRIPTION OF THE DRAWINGS

FIG. 9 is a block diagram to show a detailed composition of a graphic conversion portion in the LSI design support system of FIG. 6, FIGS. 10A and 10B are diagrams to respectively show a state transition diagram and a state transition table mutually converted to each other by the graphic conversion portion in the LSI design support system of FIG. 6.

DETAILED DESCRIPTION OF THE PREFERRED EMBODIMENTS

Hereinafter, embodiments of the present invention will be described with reference to the accompanying drawings.

Figure 1A:
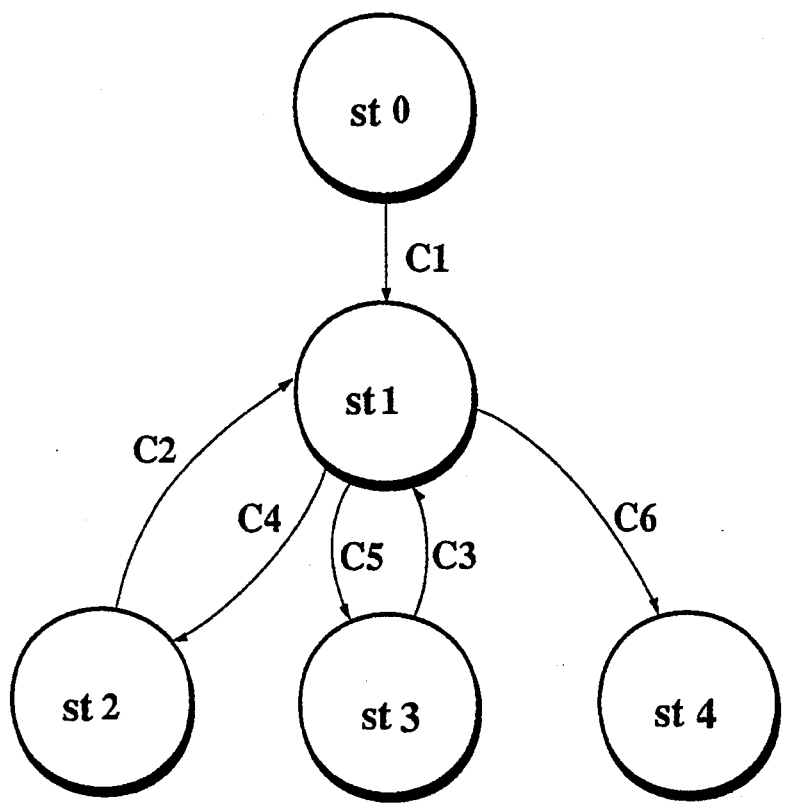
FIGS. 1A and 1B are state transition diagrams to snow relationships between a plurality of states.
Figures 1B, 1C:
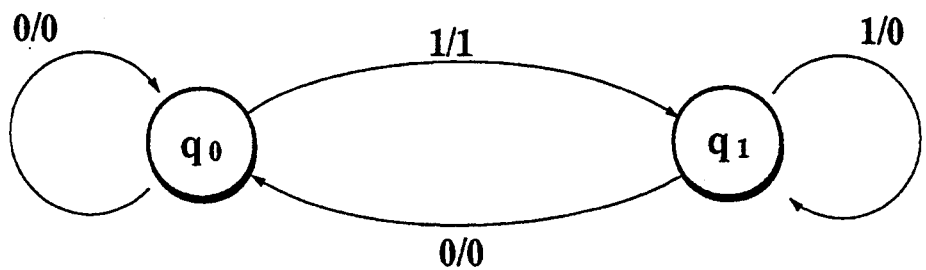
FIG. 1C is a state transition table to show relationships between the states shown in FIG. 1B.
Figure 2:
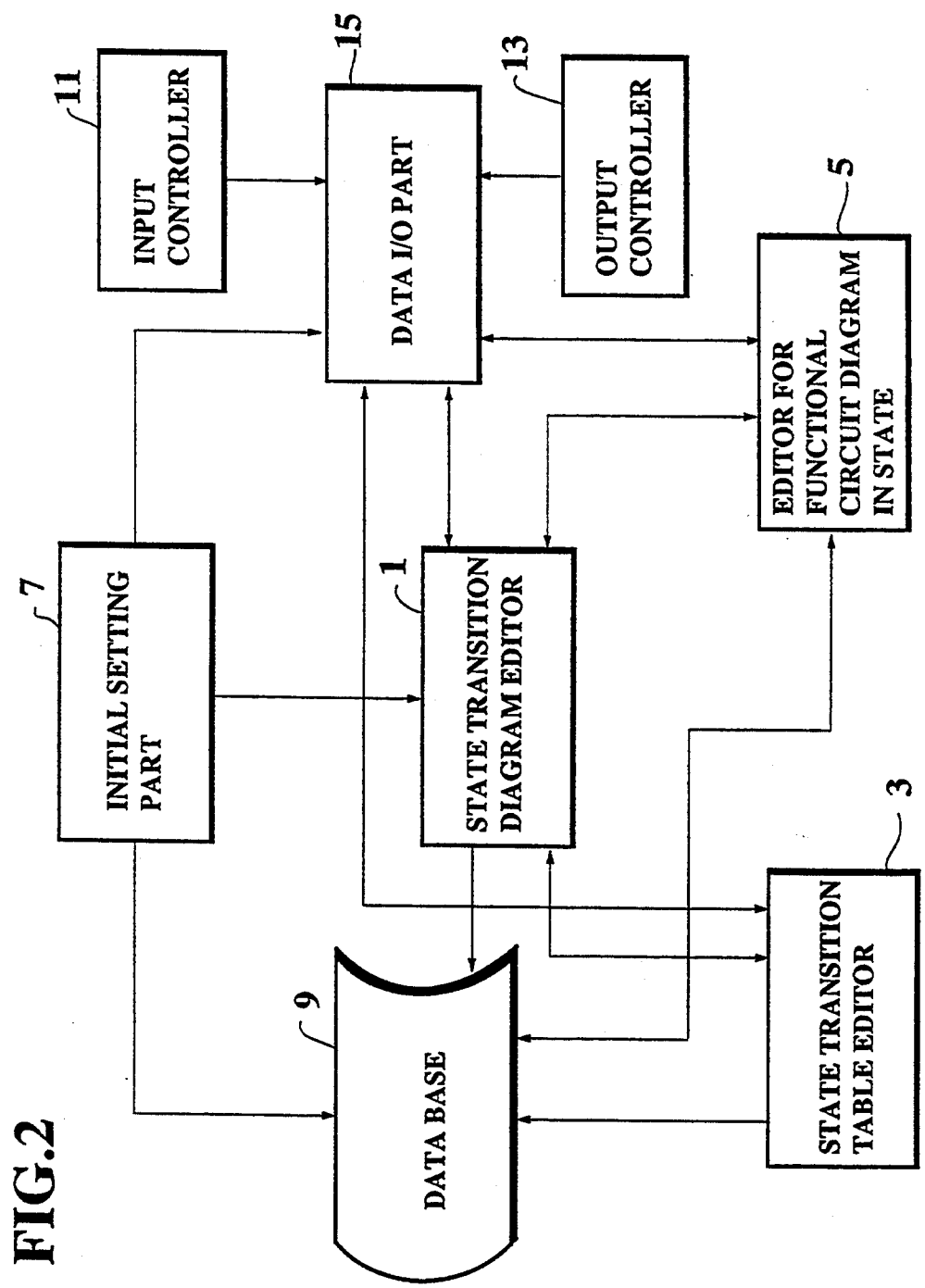
FIG. 2 is a block diagram to show a composition of an LSI design support system which is an embodiment of the present invention.
Figure 3:
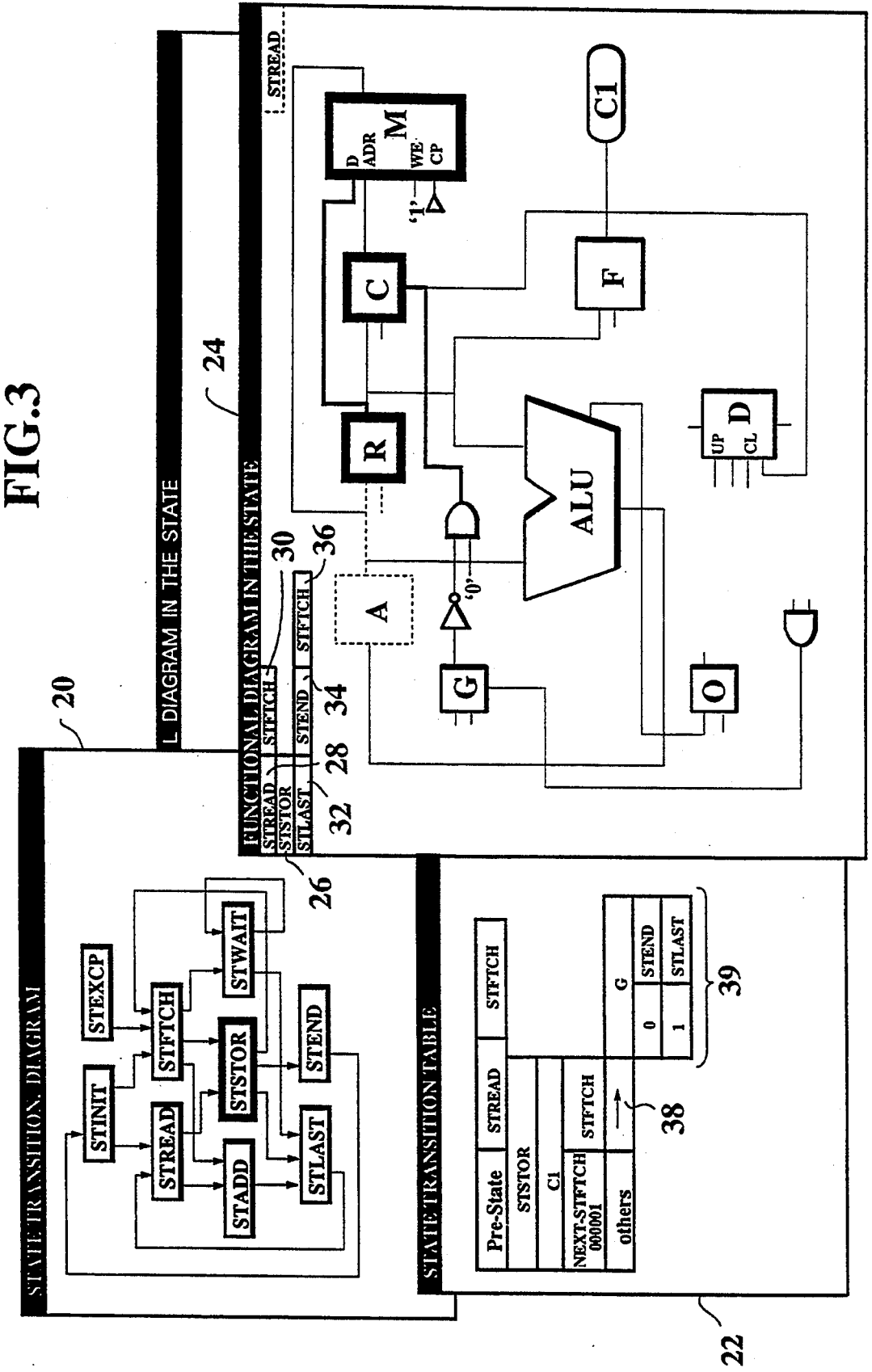
FIG. 3 is a diagram to show a display example by a picture plane in the LSI design support system of FIG. 2.

FIG. 2 is a block diagram to show composition of an LSI design support system which is an embodiment of the present invention, and FIG. 3 is a diagram to show a display example on a picture plane in the LSI design support system of FIG. 2. The LSI design support system of the embodiment is used for a function design of CPU and the like by displaying (based on a multi-window display method) a state transition diagram (STD), a state transition table (ST) and an operation circuit diagram in a state at the same time on a picture plane (Cathode-Ray Tube; CRT or the like).

As shown in FIG. 2, the LSI design support system of the embodiment mainly comprises a state transition diagram preparation portion 1, a state transition table preparation portion 3 and a state-operation circuit diagram preparation portion 5. In the state transition diagram preparation portion 1, a state transition diagram is prepared by inputting transitional relationships between a plurality of states corresponding to a functional specification of the LSI as a design object. Namely, the state transition diagram preparation portion 1 has a function as an editor. The state transition diagram is prepared as designated by, for example, a state transition diagram 20 shown in the left upper portion of FIG. 3, and displayed on the picture plane. The state transition diagram shows transitional relationships of operational states of CPU. As described above, the state transition diagram prepared by the state transition diagram preparation portion 1 is displayed on the picture plane in a form of multi-window display.

The state transition table preparation portion 3 is an editor for preparing a state transition table to set transitional conditions between transition states which are prepared by the state transition diagram 1. The state transition table is displayed on the picture plane as designated by a state transition table 22 shown in the left lower portion in FIG. 3 in a form as shown in FIG. 4.

Figure 4:
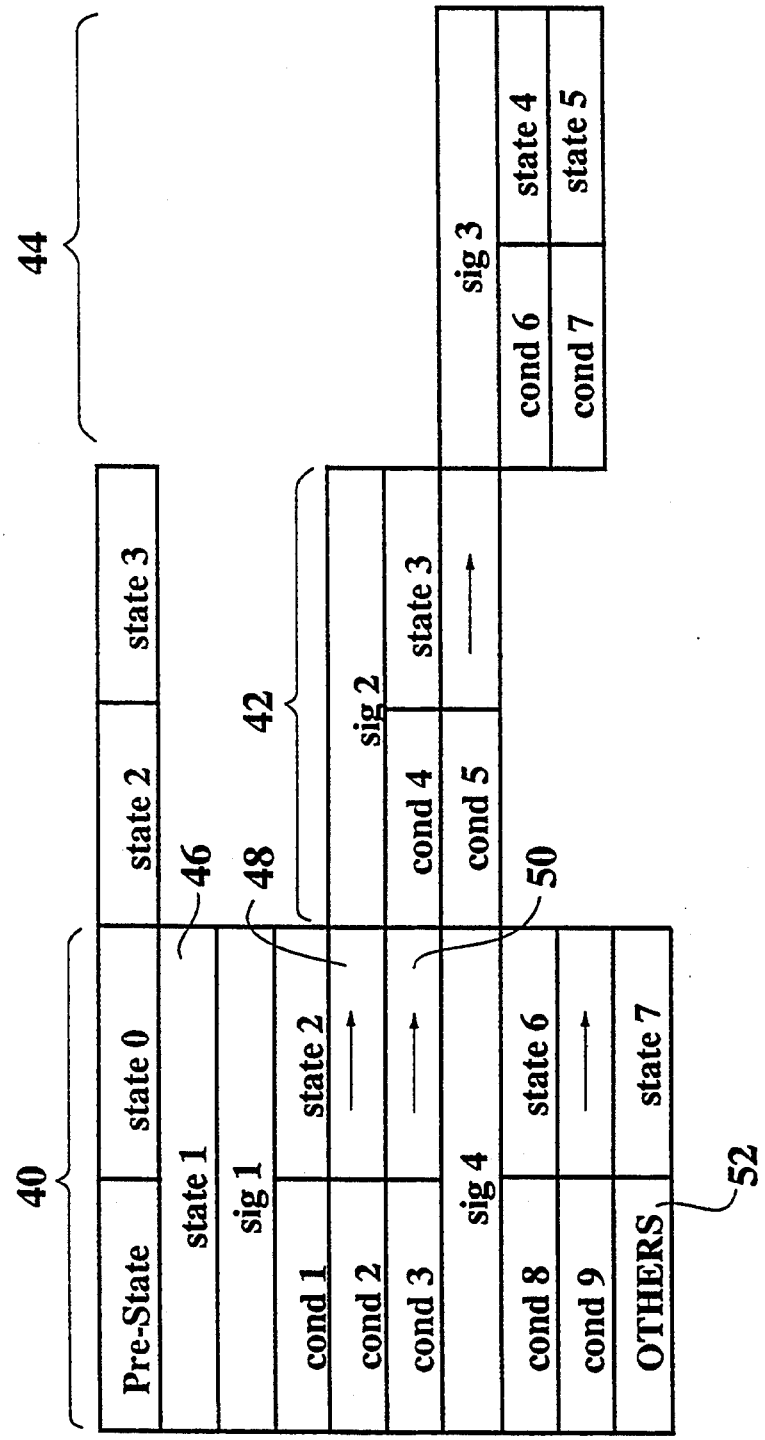
FIG. 4 is one of the display examples shown in FIG. 3, which shows a display example of a state table in a state transition table.

In state transition tables 40, 42, 44 shown in FIG. 4, a state under design is state 1 (a portion designated by reference numeral 46 in the drawing), the state transition table is prepared by inputting the target states of state 1 and the accompanying transitional conditions. Incidentally, reference characters sig 1, sig 2, sig 3, sig 4 designate condition signal names, and cond 1 to cond 9 are condition signal values respectively. In the table, when the condition signal sig 1 is a condition designated by cond 1, state 1 changes into state 2. While, when sig 1 is a condition designated by cond 2 or cond 3, an arrow mark is written in each of the target state fields 48, 50 on the right side of the condition signal values. Then, when these fields 48, 50 are designated by a mouse or the like, a field 42 of new transitional conditions and target states is displayed on the right side to further refer to the condition signal sig 2. As described above, the condition signals and the condition signal values are successively displayed in a pop-up form. It is possible to express the condition signals using logical expressions and expressions of coupled signals including relational expressions ($<$, $=$, $>$), and values other than those set by the condition signal values are expressed by OTHERS 52.

Moreover, in the state transition table preparation portion 3, an editorial function for alteration or modification of signals and the like is prepared as a menu.

Namely, according to the editorial functions, editorial works, such as addition, insertion and elimination, of the condition signals and the condition values are conducted in an interactive mode. Additionally, the state transition table preparation portion 3 has a function to look up a table transitable into a state under design in tables already prepared and to display the result on the picture plane.

The state-operation circuit diagram preparation portion 5 is an editor for preparing a state-operation circuit diagram (to show each operation of a circuit in each state) or state-operation description prepared by the state transition diagram preparation portion 1 by graphic input or description input. The circuit diagram or description comprising a language corresponding to the circuit diagram prepared by the state-operation circuit diagram preparation portion 5 is displayed in a picture plane together with the state transition diagram 20 and the state transition table 22 in a multi-window form as shown in a state-operation circuit diagram 24 in FIG. 3. At a left upper portion of the circuit diagram 24 (or the description by a language), a state under design, i.e., STSTOR 26, the previous transitable states to the state STSTOR 26, i.e., STREAD 28, STFTCH 30, and the next states to the state STSTOR 26, i.e., STLAST 32, STEND 34, STFTCH 36 are displayed as well as an operation circuit in each state. When an operation circuit in each state is designed, the state-operation circuit preparation portion 5 displays portions already designed by a fine solid line, displays operation circuits for reference in the transition states already designated by a dotted line, and displays circuit portions under design with reference to the dotted-line portions by a solid line.

An initial setting portion 7 has a function for setting initial parameters for the state transition diagram, the state transition table and the state-operation circuit diagram respectively prepared by the above-mentioned input portions 1, 3, and 5.

Data inputted by the input portions 1, 3, 5 and the initial setting portion 7 are outputted and contained in a data base 9 through an input-output control portion 15.

Accordingly, the data contained in the data base 9 are inputted or outputted through the input-output control portion 15 which is controlled by an input control portion 11 and an output control portion 13.

Hereinafter, an example of a functional design of the LSI design support system of the embodiment having the above-mentioned composition will be described.

A designer inputs a state suitable in a circuit as a design object into the state transition diagram preparation portion 1. Then, a state transition diagram is prepared with reference to a display on the picture plane. For example, in such a case as a functional design of CPU, a state transition diagram as shown by the state transition diagram 20 in FIG. 3 is prepared. In the same diagram, a fetch state of instructions (STFTCH), a read state of data (STREAD), an addition state of data (STADD), a store state of data (STSTOR) and the like are displayed on the picture plane at the same time of the input. While, the transitional relationships between the states are expressed by arrows inputted to the respective states or those outputted from the respective states. Moreover, the state (STSTOR) under design is expressed by a frame of a bold solid line.

Next, circuit operation in the state STSTOR is inputted into a state-operation circuit diagram. The state-operation circuit diagram is displayed in a form of a multi-window as shown by the state-operation circuit diagram 24 in FIG. 3. When the state STSTOR of CPU is designed, a circuit diagram which is transitable to the state STSTOR and was already designed is displayed on the picture plane by a fine solid line, and operation circuits for reference in the transition states already designed are displayed by a dotted line. For example, when a portion of a register A shown in FIG. 3 is transitable to the state STSTOR and was already designed, the portion is displayed by a dotted line. Namely, the register A is a circuit operational portion designed by the STREAD or the STFTCH of a preceding state, and is described by the dotted line. The operational results before and after states are thus showed clearly on the picture plane. In such manner, the state STSTOR in which data to be given to a memory M from a register R are stored in addresses which are given from a register C to the memory M is designed, and the register R, the register C and the memory M are displayed on the picture plane with solid lines as shown in the same diagram.

At the same time, indication of the next state to the state under design and the transitional condition are inputted into a state transition table displayed on the picture plane through the state transition table preparation portion 3 to prepare the table. For example, when a condition signal C1 is 000001 in the state STSTOR under design, STFECH is written in a target field on the right side of the condition signal C1, and when the condition signal C1 is a value of the others (OTHERS), an arrow mark 38 is written in the corresponding field.

Then, when the arrow mark 38 is clicked by a mouse, a further target state input mode appears, and a table 39 of new transition conditions and target states concerning a second condition to be nested therein is displayed in a form of a pop-up menu. Thereafter, a condition signal G is written as the second signal in the table 39. When the signal G is 0, the target state becomes STEND, and when it is 1, the target state becomes STLAST (a state waiting fetch).

The conditions and the target states to be nested to the condition signal C1 are displayed on the picture plane on the right side in a form of a pop-up menu by clicking the arrow mark to OTHERS with a mouse. Moreover, the condition signals and the condition values are altered or modified by clicking the menu expressed as an editorial function with a mouse. Additionally, in the state transition table, a name of a state which is transitable to a state under design is displayed. Thus, the relationships of states about all the functions to be designed are easily guessed.

The functional design of LSI is efficiently progressed by suitable repetition of the input preparation of the state transition diagram 20, the state transition table 22 and the state-operation circuit diagram 24.

As stated above, the divided functions necessary for the design of LSI can be displayed at the same time on a picture plane so that it becomes possible to make a design extremely near to a thought pattern of the designer and a smooth design work for the LSI can be realized. Accordingly, since it is not necessary to express states of a circuit by a great many of flip-flops as in the prior art, a short-term and facile design for a large-scale and complex circuit can be realized. Control-system circuits for generating states are automatically outputted by the logic synthesis system.

Next, an example of a circuit design system in which the LSI design support system of the embodiment is incorporated will be described.

Figure 5:
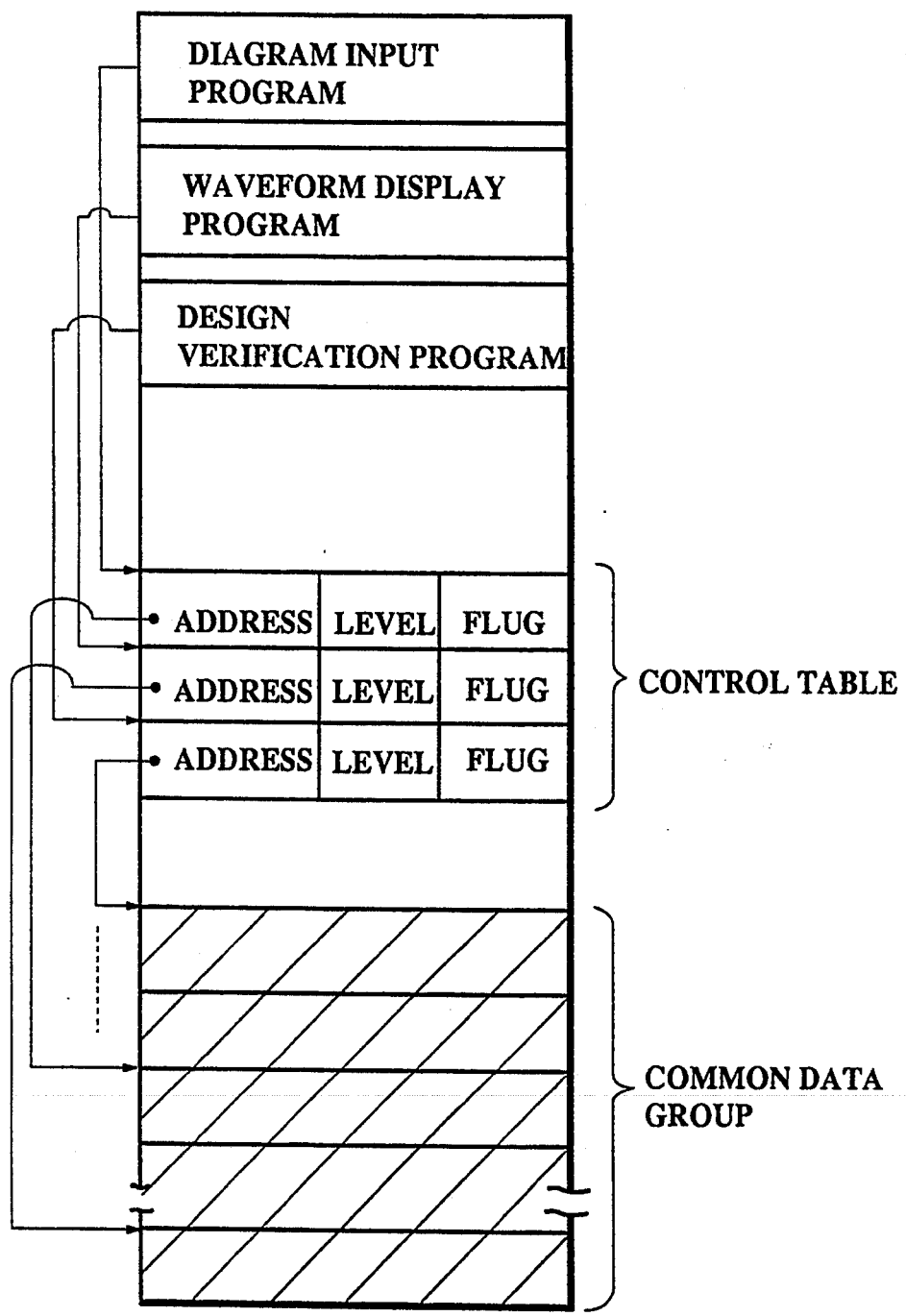
FIG. 5 is an example of a memory map in the operative mode of a circuit design system in which the LSI design support system shown in FIG. 2 is incorporated.

FIG. 5 shows an example of a memory map on the operative mode of a circuit design system in which the LSI design support system shown in FIG. 2 is incorporated. As shown in the memory map, a design diagram input program (corresponding to the LSI design support system shown in FIG. 2), a wave-form display program and a design verification program respectively contained in a memory are executed at the same time using data designated by a control table in a group of common data. In FIG. 5, the design diagram input program inputs a circuit diagram to be designed, and alters a circuit diagram already inputted therein. The wave-form display program prepares or alters an input-output wave-form in a circuit diagram displayed on the picture plane on the same picture plane. The design verification program verifies operation corresponding to a designated input wave-form and obtains an output wave-form.

Moreover, in the same diagram, the control table controls the data in a group of common data to prevent breakage and overlapping of the data when a plurality of the programs are executed at the same time, and comprises address values of a group of the common data being used in the programs on execution, level values to obtain the address values of the common data to be used, and flag values to show procedures of the programs and determine to use or not to use the common data. As stated above, since a plurality of the programs are executed at the same time, an extremely efficient circuit design can be realized.

Next, another embodiment of the LSI design support system according to the present invention will be described.

Figure 6:
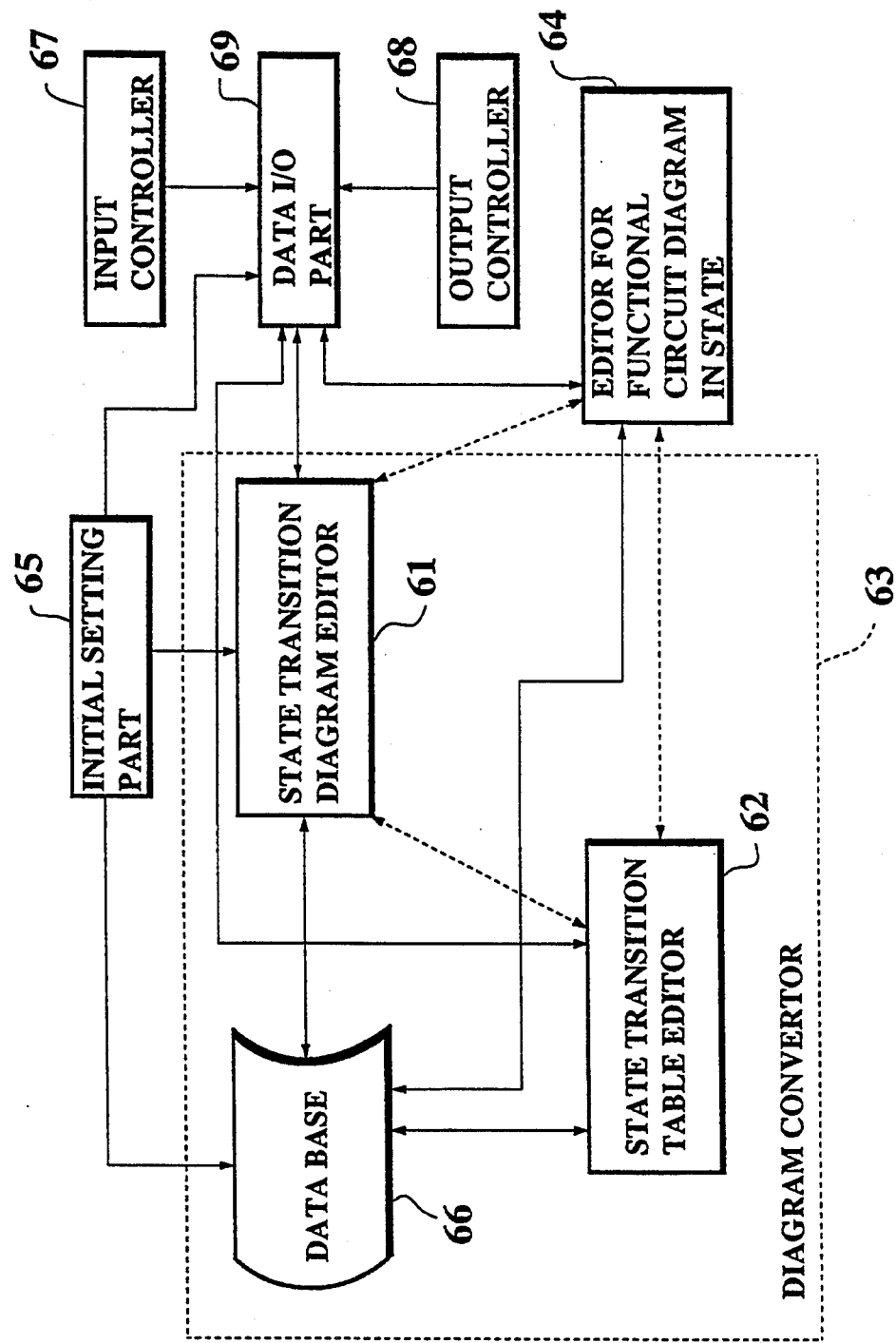
FIG. 6 is a block diagram to show a composition of an LSI design support system which is another embodiment of the present invention.

FIG. 6 is a block diagram to show a composition of an LSI design support system of another embodiment of the present invention. The LSI design support system of the embodiment can display a state transition diagram, a state transition table and a state-operation circuit diagram at the same time in a form of a multi-window to make a functional design in the same manner as described in the LSI design support system shown in FIG. 2.

The LSI design support system in the embodiment mainly comprises a graphic conversion portion 63 comprising a state transition diagram preparation portion 61, a state transition table preparation portion 62 and a data base 66, an initial setting portion 65, a state-operation circuit preparation portion 64, an input control portion 67, a data input-output control portion 69 and an output control portion 68.

The state transition diagram preparation portion 61 is an editor for inputting transitional relationships between a plurality of states of functions corresponding to the specification of an LSI to be designed to prepare a state transition diagram. The state transition table preparation portion 62 is an editor for inputting transitional conditions between a plurality of the states in the functions corresponding to the specification of the LSI to be designed to prepare a state transition table. In the state transition table preparation portion 62, editorial functions are prepared as a menu to alter or modify the conditions. Namely, with the editorial functions, editorial works such as addition, insertion and elimination on conditional signals or conditional values are carried out in the interactive mode. Moreover, the state transition table 62 looks up states transitable to a state under design from a table already prepared and displays the looked-up states on a table on the picture plane.

The graphic conversion portion 63 automatically converts a state transition diagram into a state transition table, or a state transition table into a state transition diagram. The state transition diagram and the state transition table are separated only by the difference of input expressions of data so that both indicate originally the same function. Accordingly, a designer can make a design with either of the state transition diagram or the state transition table in accordance with his choice or design object. Thus, the graphic conversion portion 63 converts a state transition diagram prepared by the state transition diagram preparation portion 61 into a state transition table, or it converts a state transition table prepared by the state transition table preparation portion 62 into a state transition diagram.

Next, the structure of the data base comprising various types of objects, which are used by the graphic conversion means, will be explained below in detail.

Figure 13A:
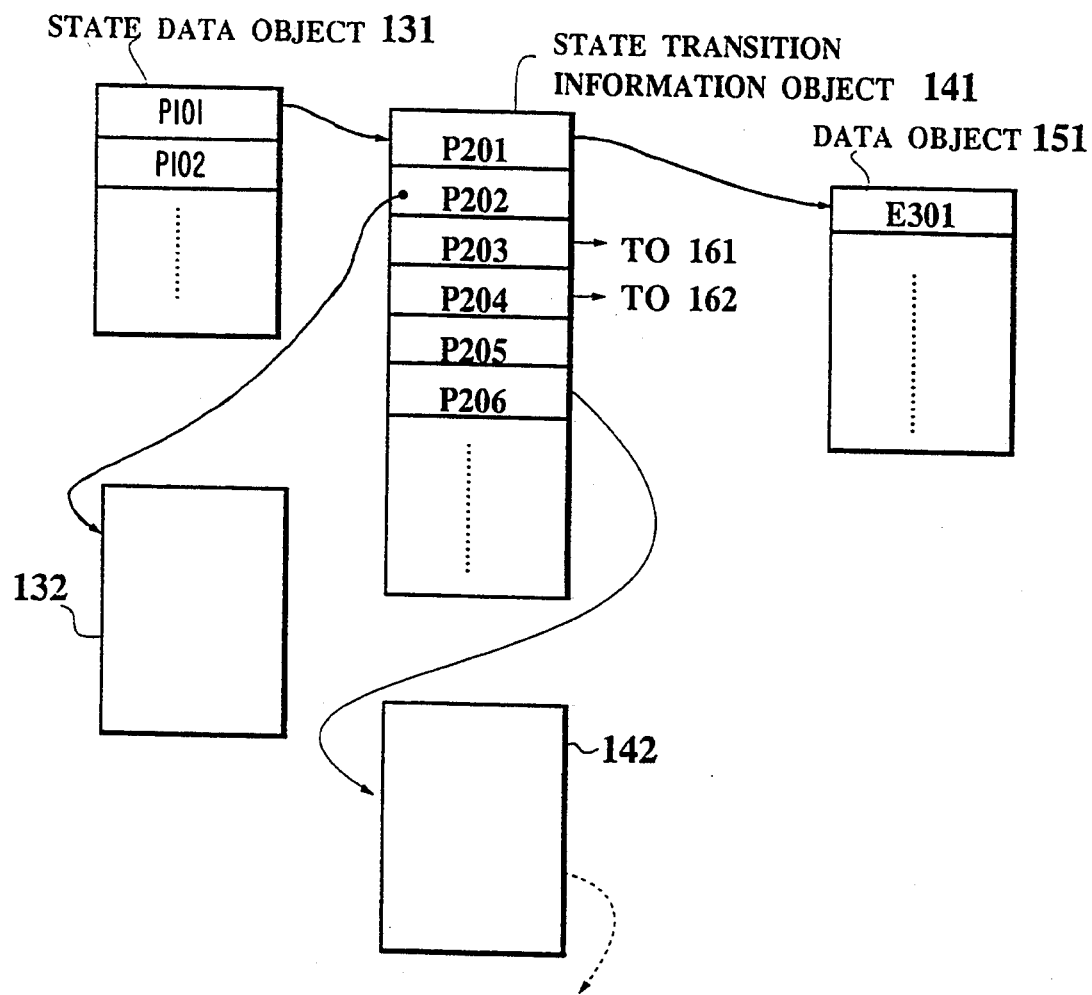
FIGS. 13A and 13B are diagrams that are used to describe the graphic conversion unit.
Figure 13B:
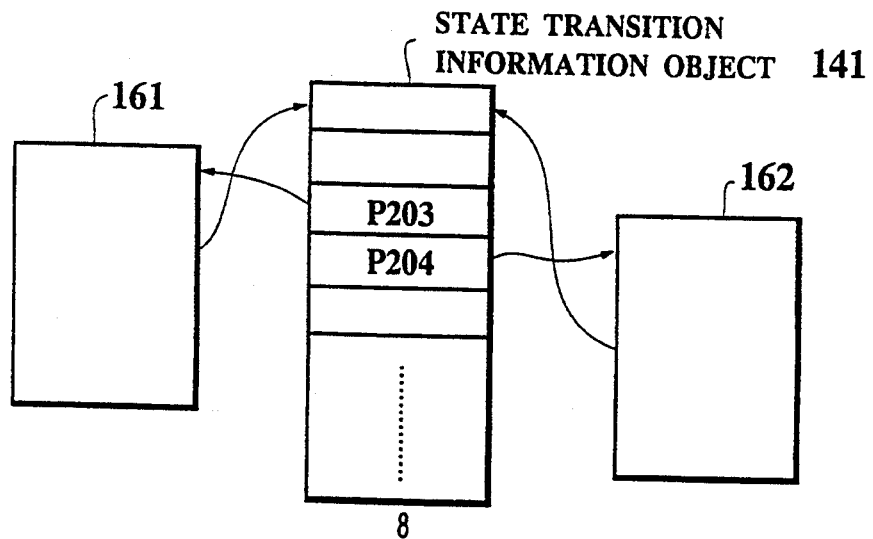

The graphical conversion means is capable of converting the contents of the state transition diagram (STD) to the state transition table or the contents of the state transition table to the STD. The operation of the graphical conversion means will now be explained referring to FIGS. 13A and 13B. FIGS. 13A and 13B are diagrams expressing a relationship between various types of objects that constitute a data structure of an LSI formed by the LSI design support system according to the present invention. The graphical conversion means generates these objects to convert the STD to the state transition table or the state transition table to the STD.

In FIG. 13A, reference numbers 131, 132 designate state data objects, reference numbers 141, 142 denote state transition information objects, a reference number 151 means a data object for a state transition condition, reference numbers 161 and 162 designate data transition information objects having a pointer for pointing a data object having an upper condition and a pointer for pointing a data object having a lower condition for transition when these conditions are nested.

The graphical conversion means generates these objects from the STD or the state transition table.

Next, the object generation operation to generate the objects through the STD by the graphical conversion means will be explained. The state data object 131 designating the name of the current state is formed from data inputted through the STD. The state data object 131 has pointers P101, P102, ... each of which points to a state transition information object 141 having the information of state transition.

In the state transition information object 141, pointers P201, P202, P203, P204, P205, and P206 are stored, for example. The pointer P201 points to the data object 151 having an expression condition E301 for the state transition operation. The pointer P202 points to a target state data object 132 that is the object of a target state for transition operation. The pointer P203 points to an upper condition of the state transition information object 161 where the conditions have a nest structure, and the pointer P204 points to a lower condition of the state transition information object 162. The state transition information object 141 has the pointer P206 that is a link chain pointer P206 when the number of the target transition states is more than one. In a state transition information object, when data is stored instead of a pointer pointing to a next target state, the state transition information object is the lowest state in a data structure having a nest structure. When a state transition table is generated with the data structure having the objects described above by the graphical conversion means, the tables corresponding to the state data objects of upper and lower states are generated based on the current state. As clearly shown in FIG. 4, in the data structure, each state data object is formed to each state transition table with one-to-one correspondence.

Accordingly, by using the graphical conversion means in the LSI design support system according to the present invention, the state transition table can be formed from the STD or the STD from the state transition table.

On the other hand, when the STD is generated with the objects obtained after forming the state transition table by using the graphical conversion means, a symbol of each state is displayed in the STD by using all the state data objects, then state transition lines by which states are connected in the STD are drawn. Accordingly, each state data object has the pointer P102 for pointing to a data object in which the information of the symbol of a state in the STD is stored. The state transition information object has the pointer P205 for pointing to a data object in which the information of the state transition line is stored.

As described above, the graphic conversion means forms the STD from the state transition table by using the various types of the objects in the LSI design support system according to the present invention, or the state transition table from the STD.

The data base comprises the various types of the objects to convert the STD to the state transition table or the state transition table to the STD.

Next, an actual physical structure of the graphic conversion means in the LSI design support system will be explained referring to FIGS. 6 and 9.

As shown in FIG. 6, in all input operations by a designer, data is input into the system through the data I/O part 69 under the control of the input controller 67.

The graphic conversion means 63 generates a state transition diagram (STD), then further generates objects (the state data object, the state transition information object, the data objects for a state transition condition, and the data transition information object), which have been already described above in detail, in accordance with the input operation which is the operation for the state transition diagram editor 61.

The steps for generating the state transition tables by using the data base comprising the various types of the objects have already been described. The steps are shown in FIG. 9. First, the transitional condition analyzer 90 generates a common data base 66 based on the state transition diagram 91 generated by using the state transition diagram editor 61. Next, the automatic table generator program executive part 96 generates a state transition table 92. The state transition table 92 can be generated with no problem because the relationship between the structure of the data base and the structure of the state transition table has one-to-one correspondence.

On the other hand, the graphic conversion means 63 generates a state transition table, then further generates objects, which have already been described above in detail, in accordance with the input operation which is the operation for the state transition diagram editor 61. The steps for generating the objects have been already described above.

The steps for generating the state transition diagram (STD) by reading out the objects in the data base is shown in FIG. 9. In the same diagram, the transitional condition analyzer 90 generates the common data base 66 based on the state transition table 92 generated by using the state transition editor 62. From the obtained data base the automatic placement and wiring program executive part 94 generates the state transition diagram (STD). The step for generating the STD has been described above. The method of the automatic placement and wiring is well known in the prior art.

As described above, by using the graphic conversion means, the state transition table can be displayed on a monitor by using data input for the state transition diagram (STD), conversely the state transition diagram (STD) can be easily generated by using data input for the state transition table.

The state-operation circuit preparation portion 64 is an editor for preparing a state-operation circuit diagram or description to show circuit operation in each state prepared by the state transition table preparation portion 62 by graphic input or description input. The circuit diagram or description by a language prepared by the state-operation circuit preparation portion 64 is displayed on the picture plane as shown by, for example, the state-operation circuit diagram 24 in FIG. 3. In the circuit diagram or description displayed on the picture plane, not only an operational circuit diagram in each state but also a state under design, STSTOR (a portion designated by reference numeral 26 in FIG. 3), the previous transitable states to the state STSTOR 26, i.e., STREAD 28, STFTCH 30, and the next states to the state STSTOR 26, i.e., STLAST 32, STEND 34, STFTCH 36 are displayed at a left upper portion of the display area of the circuit diagram. Also as shown in FIG. 3, a circuit portion corresponding to the state STSTOR of the state transition table is displayed with a bold solid line in the state-operation circuit diagram. Further, the previous state to the state STSTOR is displayed with a dotted line, and the other states are displayed with a fine solid line separately. Such discrimination of display may be carried out by coloring and the like.

The initial setting portion 65 sets initial parameters for the state transition diagram, the state transition table and the state-operation circuit diagram prepared by the input portions.

The data base 66 contains data inputted by the above-mentioned input portions and the initial setting portion 65. The data of the data base 66 are inputted or outputted through the data input-output portion 69 controlled by the input control portion 67 and the output control portion 68.

Figure 7:
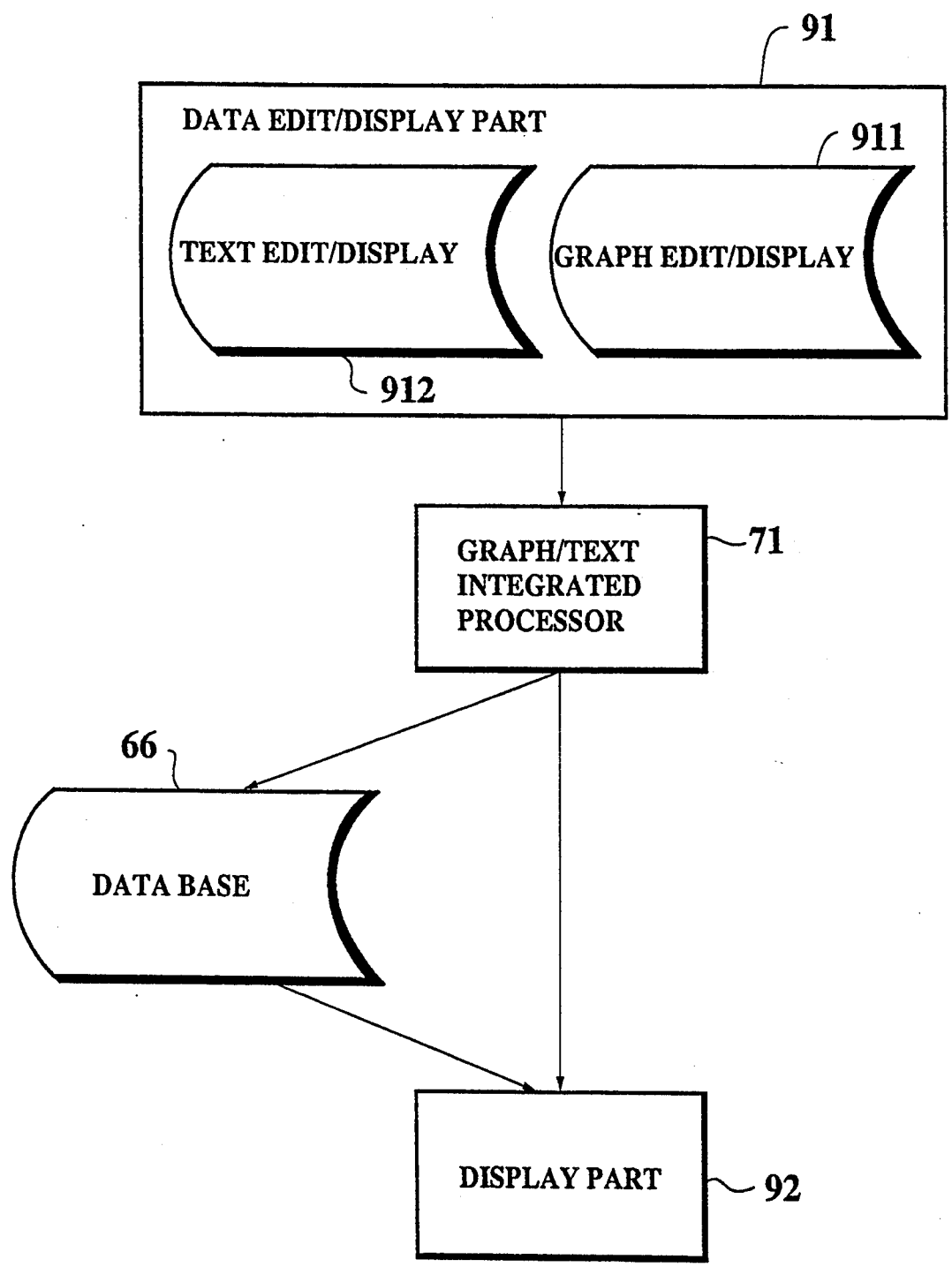
FIG. 7 is a flow chart to show a flow of processes on data input and output in the LSI design support system of FIG. 6.

The data input-output portion 69 comprises a data input display portion 91 for inputting and displaying design data, and a display portion 92 for displaying the output as shown in FIG. 7. Further, the data input display portion 91 comprises a graphic-input display portion 911 for performing graphic input and display, and a language-input display portion 912 for performing language input and display. These graphic input and language input are independently displayed at the same time. Moreover, these graphic input and language input are immediately converted by a graphic-language integrated data processor 71 corresponding to the input control portion 67 shown in FIG. 6 and contained in the data base 66.

Next, operation of the LSI design support system of the embodiment having the above-mentioned composition will be described.

Figure 8:
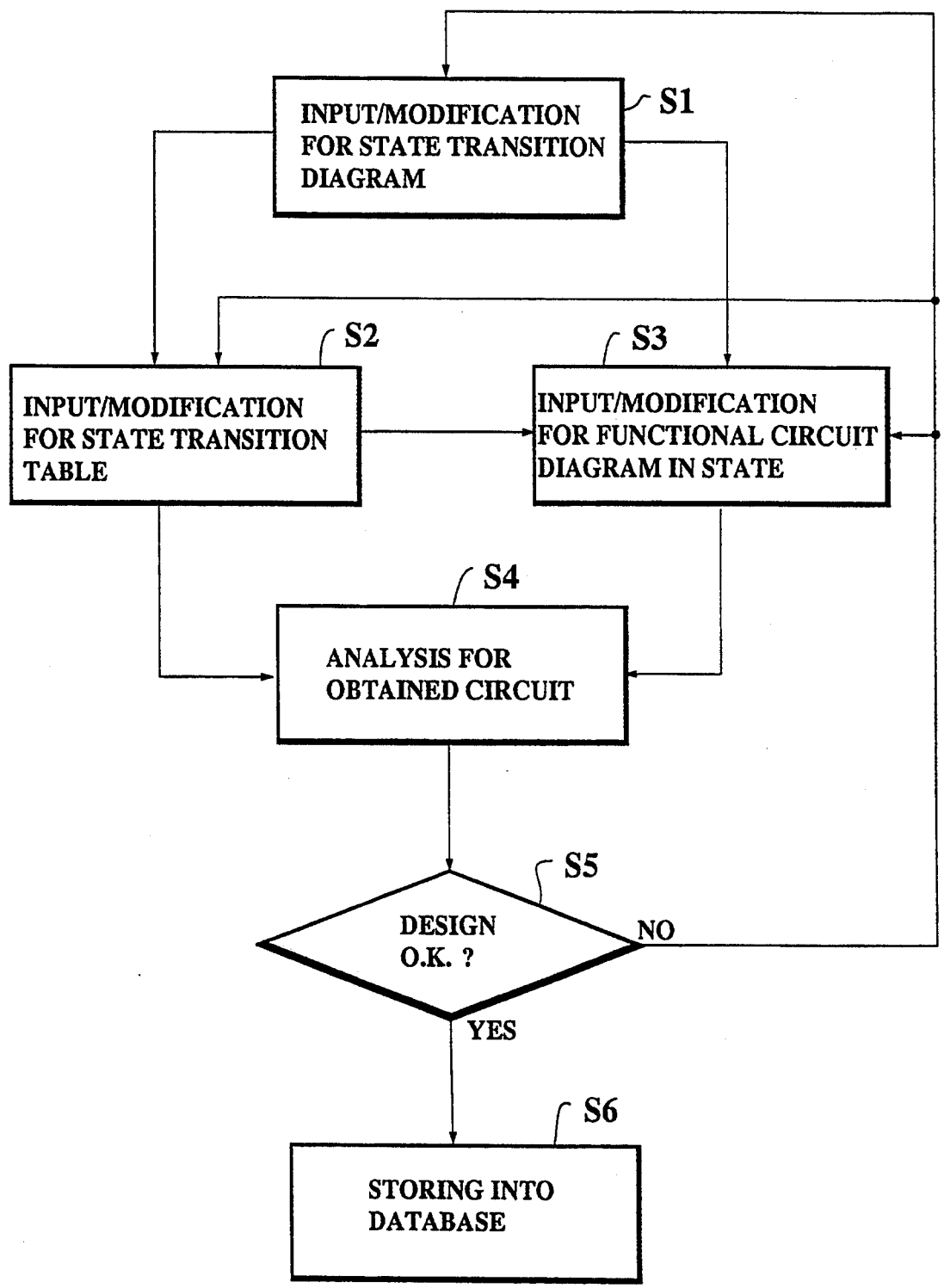
FIG. 8 is a flow chart to show an LSI design procedure using the LSI design support system of FIG. 6.

AS shown in a flow chart of FIG. 8, a general data flow between modules of specific operation, for example finite state machines such as CPU, is designed on the state transition diagram. Then, a state transition for each module is designed using the state transition diagram or the state transition table (Steps S1, S2).

Next, internal operation for each state symbol is designed in consideration of the system clock. In this case, when a symbol corresponding to the design is selected by a mouse, an editor for the state transition table or the state-operation circuit preparation is opened. While, when a polyphase clock is considered, internal operation state diagrams are prepared respectively corresponding to each phase of $\phi$, $\phi 2$, $\phi 3$, . . . , $\phi N$. A clock not specifically designating anything in the internal operation is dealt with as a system clock. When operation in each state is prepared in the circuit diagram, a functional block, such as ALU, REG, is used (Step S3).

With respect to the signal names used in the state transition or the circuit diagram, undefined signal names or contradictory points in the transition relationships are checked through a check program during the design (Steps S4, S5).

Then, the results are contained in the data base (Step S6).

Next, with the data contained in the data base, condition data on the state transition relationships or the circuit operation are extracted through a function-description conversion program to prepare functional description. The functional descriptions are used as input data for a function simulator and a logic synthesis and functional test generating system.

In the state transition diagram preparation step, a designer inputs a state suitable for a circuit to be designed into the state transition diagram preparation portion 61 so as to prepare a state transition diagram with reference to a display on the picture plane. For example, in such a case as a functional design of CPU, a state transition diagram as shown by the state transition diagram 20 in FIG. 3 is prepared. In the same diagram, a fetch state of instructions (STFTCH), a read state of data (STREAD), an addition state of data (STADD), a store state of data (STSTOR) and the like are displayed as states of CPU. The data to show these states are displayed on the picture plane at the same time of the input. While, the transitional relationships between the states are expressed by arrows inputted to the respective states or those outputted therefrom. Moreover, the state (STSTOR) under design is expressed by a frame of a bold solid line.

At the same time as the state transition diagram preparation by the state transition preparation portion 61, the graphic conversion portion 63 automatically prepares the state transition table 22 as shown in FIG. 3 and displays the table 22 on the picture plane corresponding to the state STSTOR under design.

Next, operation of the graphic conversion portion 63 will be described with reference to FIGS. 9 and 10.

The graphic conversion portion 63 comprises a transitional-condition analysis portion 90 for analyzing transitional conditions from a state transition diagram 91 obtained by the state transition diagram preparation portion 61 or from a state transition table 92 obtained by the state transition table preparation portion 62, an automatic-layout-wiring program execution portion 94 for preparing a state transition diagram from state transition table data once contained in the common data base 66, and an automatic-table-preparation program execution portion 96 for preparing a state transition table from state transition diagram data contained in the data base 66.

In the state transition diagram 91, the state symbols are respectively connected with transitional-condition labels, or when they are not connected, transitional conditions and the target states are described as labels at the output sides of the state symbols.

In the transitional-condition analysis portion 90, transitional-condition signal names, signal values and the target-state names are extracted from data inputted from the editorial picture plane of the state transition diagram or the state transition table, classified in accordance with their conditional signal names, and then contained in the data base 66. For example, with respect to a state designated by st1, as shown in FIG. 10A, in which data from the state transition diagram are inputted, transition state of the state is changed by signals designated by A and B. Namely, A and B are extracted as state transitional-condition signals in this case. While, the transitional conditions are expressed by signal values obtained by bit coupling of the signals A and B, e.g., A!!B.

In the case of state transition of st1 into st2 on condition that the signal A is 0, the signal B may be any given value. When the signal B is regarded as "Don't Care" that is, when the signal B is designated by a symbol "?" the transitional condition can be expressed by "A!!B=0?". While, in case of state transition of st1 into st3, the transitional condition is expressed by "A!!B=10" when the signal A is 1 and B as 0. These analysis results are once contained in the common data base 66. Data extracted from the common data base 66 are expressed in a state transition table as shown in FIG. 10B. On the contrary, data from the state transition table shown in FIG. 10B are converted into a state transition diagram through the graphic conversion portion 63. Incidentally, also in case that conditions to be expressed are nested as in the state transition table 22 in FIG. 3, a similar analysis is made.

The automatic-layout-wiring program execution portion 94 retrieves transitional conditions and transitional relationships from the common data base 66, makes a layout of the state symbols on the state transition diagram editor, and automatically makes wiring with giving the transitional conditions as labels thereto to prepare the state transition diagram 91.

The automatic-table-preparation program execution portion 96 extracts data respectively arranged in accordance with the transitional conditions from the common data base 66 to automatically prepare the state transition table 92.

The state transition table 22 in FIG. 3 may be prepared by inputting the transitional conditions and the target-state names to the state under design in the state transition table 62. When the data of the state transition table 62 are inputted, names and values of the conditional signals to be inputted must not be decoded in particular. Until the transitional conditions are decoded, character rows may be inputted as reference for establishment of the conditions. While, the transitional-condition signal may be designated as "NEXT-STFTCH" using a name of the target state. The signal is dealt as a signal whose value becomes "1" when the next transition state is STFTCH. Similarly, "PREV-STFTCH" is expressed as a signal whose value becomes "1" when the previous state to the present state is STFTCH.

In the state transition table 22 in FIG. 3, when the conditional signal C1 is NEXT-STFTCH, STFTCH is written in the right field of the target state, or when the conditional signal C1 is one of the others, an arrow mark is written in the field.

When the arrow mark is clicked by a mouse, the mode further changes into a target state input mode, a table for transitional conditions and the target states concerning a second condition to be nested therein is displayed anew on the right side in a form of a pop-up menu. When a signal condition G is written in the table as the second condition, and the conditional signal G is "0", the target state becomes STEND, and when it is "1", the target signal is written as STLAST (which means a state for waiting fetch).

Figure 11:
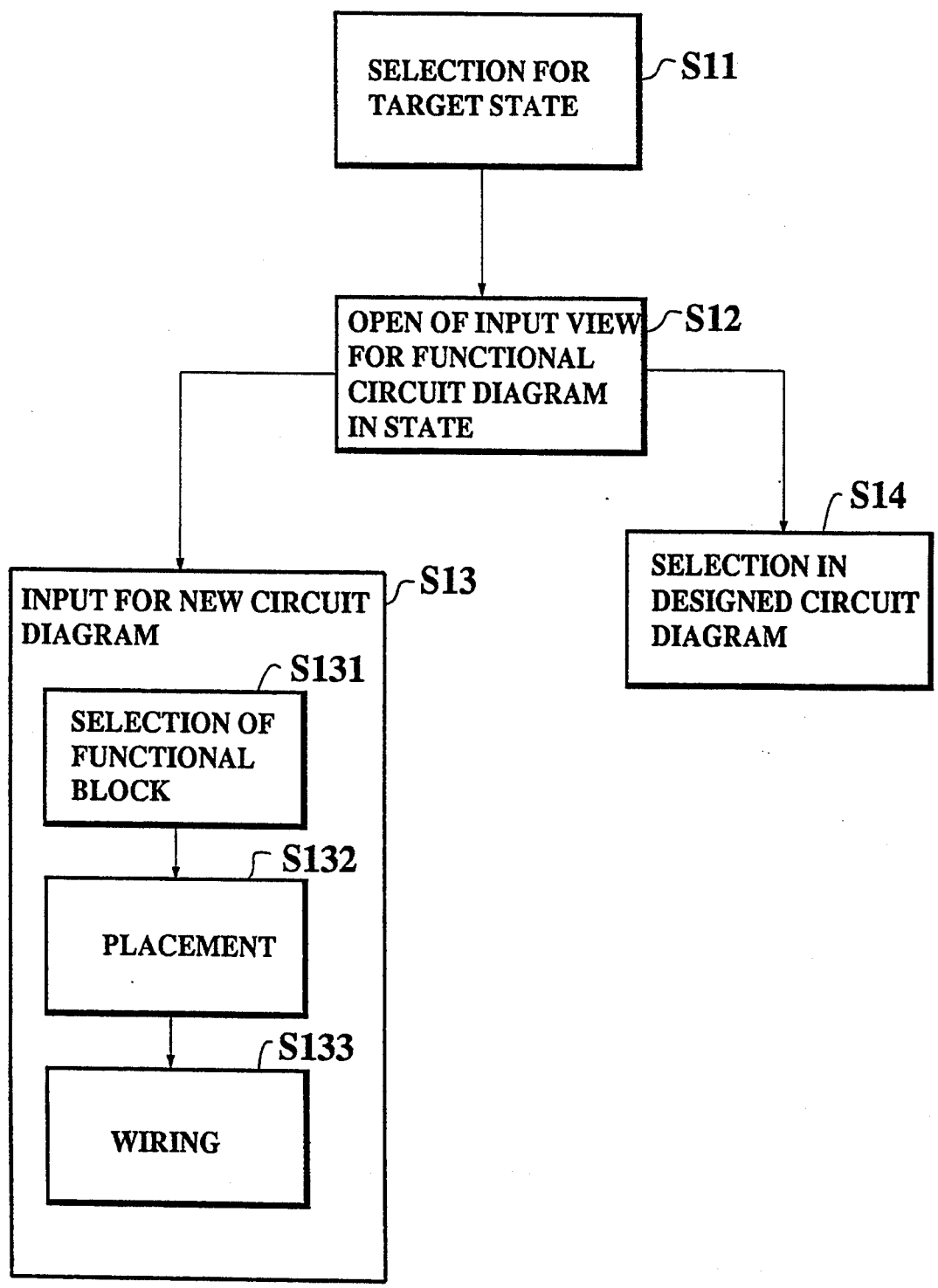
FIG. 11 is a flow chart to explain operation of a state-operation circuit preparation portions in the LSI design support system of FIG. 6.

In the state-operation circuit preparation portion 64, as shown in FIG. 11, selection of operational states to be designed is executed on the state transition diagram or the state transition table (Step S11).

Then, an input picture plane for the state-operation circuit diagram is opened (Step S12).

Thereafter, the step-operation circuit diagram or description is prepared by graphic input or description input. There are two methods for the design input method. One is a method of inputting a circuit diagram anew (Step S13), and the other is a method of selecting operational portions in the present state in circuits already inputted (Step S14).

Figure 12:
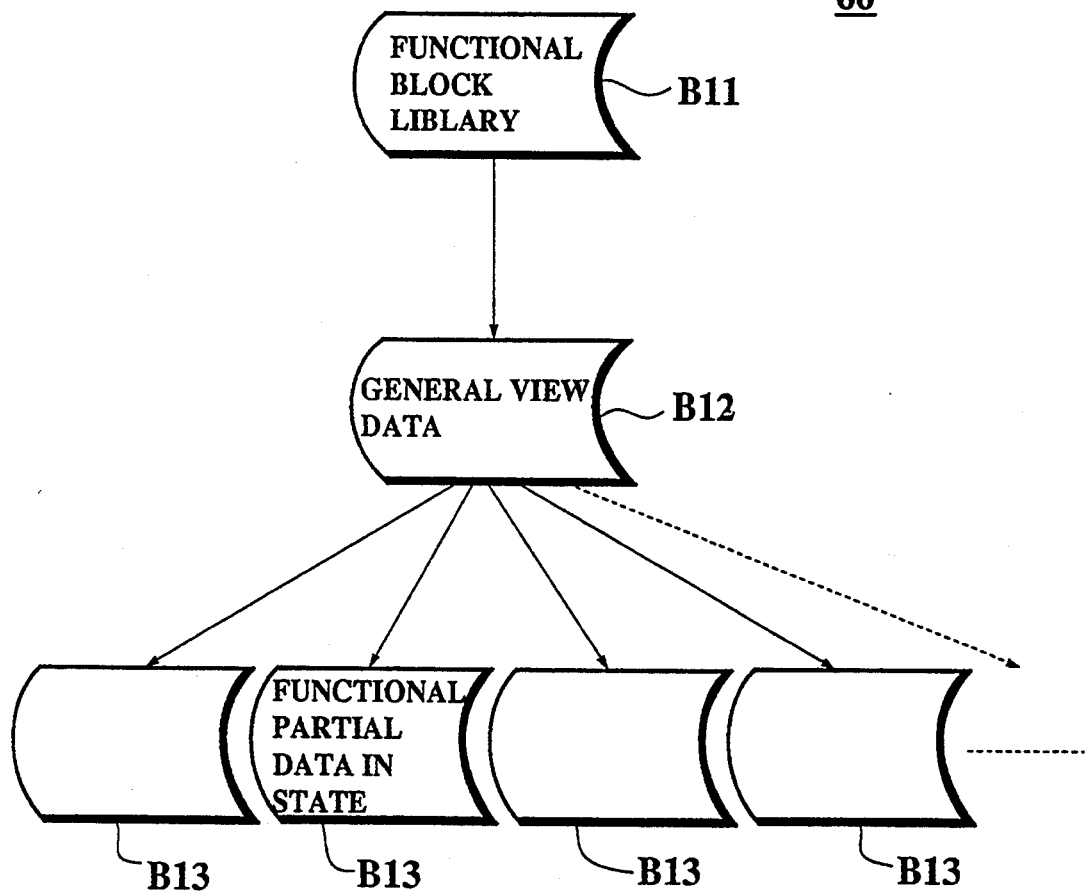
FIG. 12 is a compositional diagram of circuit data to be prepared in the state-operation circuit preparation portion in the LSI design support system of FIG. 6.

In case that a circuit is inputted anew, functional blocks to be inputted are selected from a library B11 of the data base 66 as shown in FIG. 12 (Step S131), then the functional blocks selected are respectively arranged (Step S132), thereafter wiring or naming of signal names is carried out (Step S133).

The so-inputted data of the circuit are preserved in a total-data area B12 of the data base 66, and their instances and pointers for connection are preserved in the respective operational-portion tables B13.

In step S14 in FIG. 11, when the operational portions are selected from circuits already inputted, instances and pointers for connection of other operational portions preserved in the operational-portion tables B13 are designated as those commensurate with the operational portion to be selected, then the instances and the pointers are preserved in operational-portion tables corresponding to the state to be designed.

When the state under design is STSTOR as shown in the state transition diagram 20 in FIG. 3, the state-operation circuit preparation portion 64 prepares the state-operation circuit diagram 24 in the same diagram and displays it. In the display on the picture plane, the operative portions in the state STSTOR under design are displayed with bold solid lines, the circuit portions which are transitable to the state STSTOR and already designed are displayed with fine solid lines, and operation circuits for reference in the transition state already designed are displayed by a dotted line, and the other portions are displayed with fine solid lines separately. Moreover, when the portions corresponding to the registers A, R, C and the memory M shown in the state-operation circuit diagram 24 in FIG. 3 are transitable to the state STSTOR and already designed, these are displayed with dotted lines. Namely, the register A is a circuit operational portion designed by the STREAD or the STFTCH of a preceding state, and is described by the dotted line. The operational results before and after states are thus showed clearly on the picture plane.

In such a state, in case of the design of the state STSTOR, the state STSTOR, the data to be given to the memory M from the register R are stored in the addresses to be given from the register C to the memory D, is designed with reference to these circuit diagrams, then the registers R and C and the memory M are displayed on the picture plane with bold solid lines as shown in the state-operation circuit diagram 24 in FIG. 3. Thereafter, modification, such as insertion, elimination or shifting of the state-operation circuit data, on the portions displayed with bold solid lines is carried out.

Also in the circuit diagram, the signals "PREV-" and "NEXT-" can be directly set. Moreover, when the circuit diagram includes a portion having a branch of the state transition by conditions, the conditional symbol C1 is set at the portion so that output values of the symbol G and the target-state names at the time are displayed in a table by clicking the symbol C1 with a mouse. The same function can be seen in branch portions of the conditional symbols or data.

In case of the polyphase clock, the state transition tables and the state-operation circuit diagrams are designed corresponding to the respective clock phases.

In such a manner, the functional design of LSI can be effectively carried out by suitable repetition of the input preparation and modification of the state transition diagram, the state transition table and the state-operation circuit diagram. Moreover, since the functions of LSI are dividedly displayed at the same time on a picture plane in the design of LSI, it is possible to provide a design environment in which each the circuit state is sufficiently cared about. Furthermore, it is possible to design a large-scale and complex circuit in a short term with facility.

Various modifications will become possible for those skilled in the art after receiving the teaching of the present disclosure without departing from the scope thereof.

What is claimed is:

1. An LSI design support system, comprising:
   state transition diagram preparation means for preparing a state transition diagram to show transitional relationships between states of circuit operation by graphic input;
   state transition table preparation means for preparing a state transition table to show transitional conditions between transitable states in the state transition diagram prepared by the state transition diagram preparation means;
   state-operation circuit diagram preparation means for preparing an operational expression diagram to show operations corresponding to states in the state transition diagram; and
   display means for displaying the state transition diagram, the state transition table, and the operational expression diagram;
   wherein in the operational expression diagram, a circuit which has already been designed is displayed by a first type of line, a circuit for reference in a transition state which has already been designed is displayed by a second type of line, and a circuit portion which is being designed is displayed by a third type of line.

2. An LSI design support system according to claim 1, wherein
   input-output of data for the state transition diagram preparation means, the state transition table preparation means and the state-operation circuit diagram preparation means is displayed by the display means.

3. An LSI design support system according to claim 1, wherein
   the operational expression diagram prepared by the state-operation circuit diagram preparation means is a circuit diagram.

4. An LSI design support system according to claim 1, wherein
   the operational expression diagram prepared by the state-operation circuit diagram preparation means is a description including descriptive characters and descriptive symbols.

5. An LSI design support system according to claim 1, wherein
   the operational expression diagram prepared by the state-operation circuit diagram preparation means includes a circuit diagram and a description including descriptive characters and descriptive symbols.

6. An LSI design support system according to claim 1, wherein
   the state transition table preparation means has a function to display names of states transitable to a state under design through the display means, and prepare the state transition table by inputting transitional conditions and target states for the transitable states in the interactive mode through the display means, and describing the transitional conditions and names of the target states.

7. An LSI design support system according to claim 1, wherein
   the display means is a CRT.

8. An LSI design support system according to claim 1, wherein
   the state transition diagram, the state transition table, and the operational expression diagram are respectively displayed on the display means at the same time.

9. An LSI design support system, comprising:

state transition diagram preparation means for preparing a state transition diagram to show transitional relationships between states of a circuit by graphic input;

state transition table preparation means for preparing a state transition table to show transitional conditions between transitable states of the circuit using data input for state transition;

state-operation circuit diagram preparation means for preparing an operational expression diagram to show operations corresponding to states shown by the state transition diagram prepared by the state transition diagram preparation means and the state transition table prepared by the state transition table preparation means;

graphic conversion means for bi-directionally converting between the state transition diagram and the state transition table; and display means for displaying the state transition diagram, the state transition table, the operational expression diagram, and state transition conversion graphics;

wherein a circuit which has already been designed, a circuit for reference to a transition state which has already been designed, and a circuit which is being designed are respectively represented by different types of lines in the operational expression diagram.

10. An LSI design support system according to claim 9, wherein the operational expression diagram prepared by the state-operation circuit diagram preparation means is a circuit diagram.

11. An LSI design support system according to claim 9, wherein the operational expression diagram prepared by the state-operation circuit diagram preparation means is a description including descriptive characters and descriptive symbols.

12. An LSI design support system according to claim 9, wherein the operational expression diagram prepared by the state-operation circuit diagram preparation means includes a circuit diagram and a description including descriptive characters and descriptive symbols.

13. An LSI design support system according to claim 9, wherein input-output of data for the state transition diagram preparation means, the state transition table preparation means, and the state-operation circuit diagram preparation means is displayed by the display means.

14. An LSI design support system according to claim 9, wherein the state transition table preparation means has a function to display names of states transitable to a state under design through the display means, and prepare the state transition table by inputting transitional conditions and target states for the transitable states in the interactive mode through the display means, and describing the transitional conditions and names of the target states.

15. An LSI design support system according to claim 9, wherein the state transition diagram, the state transition table, and the operational expression diagram respectively displayed by the display means are displayed at the same time.

16. An LSI design support system according to claim 9, wherein the display means is a CRT.

17. An LSI design support system, comprising:

state transition diagram preparation means for preparing a state transition diagram to show transitional relationships between states of circuit operation by graphic input;

state transition table preparation means for preparing a state transition table to show transitional conditions between transitable states in the state transition diagram prepared by the state transition diagram preparation means;

state-operation circuit diagram preparation means for preparing an operational expression diagram to show operations corresponding to states in the state transition diagram such that the operational expression diagram can be separately expressed into a circuit portion which is operative in a state, another circuit portion which is operative in another state, and other circuit portions; and display means for displaying at least one of the state transition diagram, the state transition table, and the operational expression means;

wherein in the operational expression diagram, a circuit which has already been designed is displayed by a first type of line, a circuit for reference in a transition state which has already been designed is being displayed by a second type of line, and a circuit portion which is being designed is displayed by a third type of line.

18. An LSI design support system according to claim 17, wherein the operational expression diagram prepared by the state-operation circuit diagram preparation means includes a circuit diagram and description including descriptive characters and descriptive symbols.

19. An LSI design support system according to claim 17, wherein the state transition diagram prepared by the state transition diagram preparation means, the state transition table prepared by the state transition table preparation means, and the operational expression diagram prepared by the state-operation circuit diagram preparation means are respectively displayed on the display means at the same time.

* * * * *